United States Patent [19]

Razavi

[11] Patent Number: 5,428,318
[45] Date of Patent: Jun. 27, 1995

[54] VOLTAGE CONTROLLED RING OSCILLATOR PRODUCING A SUM OUTPUT

[75] Inventor: Behzad Razavi, Aberdeen, N.J.

[73] Assignee: AT&T Corp., Murray Hill, N.J.

[21] Appl. No.: 196,602

[22] Filed: Feb. 15, 1994

[51] Int. Cl.[6] .................. H03B 5/02; H03B 27/00
[52] U.S. Cl. ........................... 331/57; 331/45;
                                      331/60; 331/177 R
[58] Field of Search ............... 331/45, 57, 60, 177 R

[56] References Cited

U.S. PATENT DOCUMENTS

| | | | |
|---|---|---|---|
| 4,797,586 | 1/1989 | Traa | 307/603 |
| 5,175,452 | 12/1992 | Lupi et al. | 307/591 |
| 5,180,994 | 1/1993 | Martin et al. | 331/57 X |
| 5,191,301 | 3/1993 | Mullgrav, Jr. | 331/57 |
| 5,194,831 | 3/1993 | Jackson | 331/111 |
| 5,262,735 | 11/1993 | Hashimoto et al. | 331/45 |

OTHER PUBLICATIONS

A. W. Buchwald, et al. "A 6"GHz Integrated Phase-Locked Loop Using AlGaAs/GaAs Heterojunction Bipolar Transistors" *IEEE Journal Of Solid–State Circuits*, vol. 27, No. 12 pp. 1752–1761 12 Dec. 1992.

"High-Frequency Voltage-Controlled Oscillator," *IBM Technical Disclosure*, vol. 33/5, pp. 260–262, Oct., 1990.

J. Choma, Jr., "Actively-peaked Broadbanded Monolitic Amplifier," *Proc. IEEE* vol. 127, pp. 61–66, Apr. 1980.

*Primary Examiner*—Siegfried H. Grimm
*Attorney, Agent, or Firm*—Oleg E. Alber

[57] ABSTRACT

A voltage controlled ring oscillator whose frequency does not depend on the number of stages in the ring oscillator. The inventive voltage controlled ring oscillator comprises N inverters connected in series with the output of the Nth inverter being coupled into the input of the first inverter. The output of each inverter is connected to a transconductance amplifier. The outputs of all transconductance amplifiers are summed. The oscillation period of the circuit is $2t_d$, (where $t_d$ is the delay of one inverter) which is independent of the number of inverters in the ring oscillator.

9 Claims, 2 Drawing Sheets

5,428,318

VOLTAGE CONTROLLED RING OSCILLATOR PRODUCING A SUM OUTPUT

FIELD OF THE INVENTION

This invention relates to electrical circuits and specifically to ring oscillators and voltage controlled oscillators.

BACKGROUND OF THE INVENTION

Phase locked loops are used in many diverse applications, including optical serial data links, multiple clock frequency generation, and FM demodulation. An important component of a phase locked loop is a voltage controlled oscillator (VCO). One type of VCO is a ring VCO which is typically composed of N stages of inverters with the outputs of the Nth stage being coupled to the inputs of the first stage. An external control voltage is also connected to each of the inverters to control the delay, $t_d$ of the inverters. The oscillation frequency of the circuit is determined by the number of stages N in the circuit and the bias current of the individual stages. Each stage has an oscillation period of $2t_d$. Thus a three stage ring oscillator has an oscillation period of $6t_d$.

Ring VCOs having fewer than three stages typically have severe reliability issues due to insufficient phase shift and incomplete switching. Another drawback of ring VCOs is the inability to decrease the oscillation period without decreasing the number of stages. This problem has become more critical as demands on integrated circuit performance have increased. The highest oscillation frequency which a VCO may achieve may be considerably less than the maximum frequency possible for the logic technology. Thus, it is desirable to provide a ring VCO design that has a reduced oscillation period which does not suffer from insufficient phase shift and incomplete switching.

SUMMARY OF THE INVENTION

This invention is embodied in an article that comprises a voltage controlled ring oscillator whose frequency does not depend on the number of stages in the ting oscillator. The inventive voltage controlled ting oscillator, using ECL (emitter coupled logic), BiCMOS (bipolar complementary metal-oxide semiconductor) or CMOS (complementary metal-oxide semiconductor) technology, typically comprises N inverters connected in series with the output of the Nth inverter being coupled into the input of the first inverter. An external control signal is also connected to the control port of each inverter. The output of each inverter is connected to a transconductance amplifier. The outputs of all each of the N transconductance amplifiers are summed. The oscillation period of the circuit is $2t_d$, which is independent of the number of inverters in the ring oscillator.

DETAILED DESCRIPTION

Figure 1:
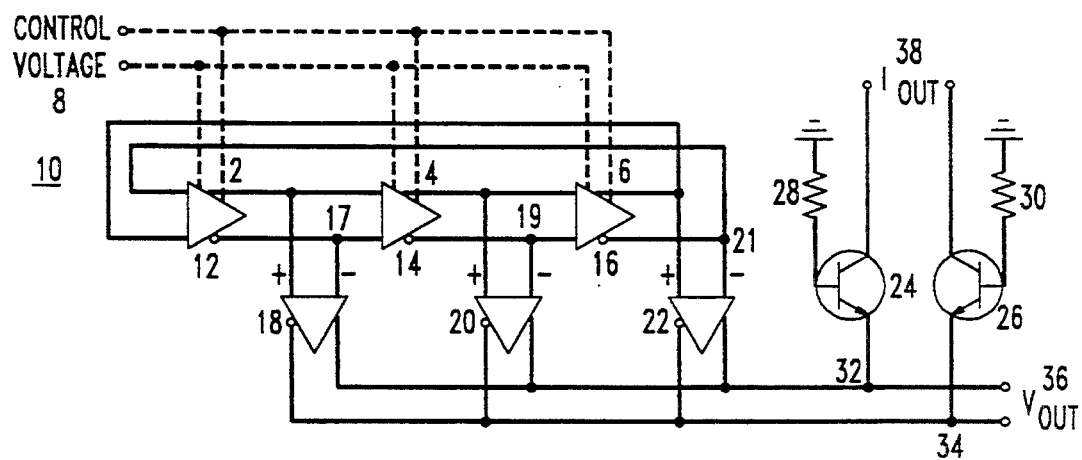
FIG. 1 is schematic diagram of an exemplary embodiment of the invention of a ring voltage controlled oscillator.

Referring to the drawings, FIG. 1 schematically illustrates an exemplary embodiment of the invention as a ring voltage controlled oscillator (VCO) 10. The oscillator 10 is comprised of three inverters 12, 14, 16 which are serial connected. The outputs 21 of the third inverter 16 are coupled into the inputs of the first inverter 12. A control voltage 8 is connected to the control input 2, 4, 6 of each inverter 12, 14, 16. This constitutes a ring oscillator. Connected to the outputs 17, 19, 21 of each inverter is a transconductance amplifier 18, 20, 22, which senses the output voltages of the inverters, 12, 14, 16 respectively. The outputs of the transconductance amplifiers 18, 20, 22 are summed at the emitters of common base transistors 24 and 26, nodes 32 and 34, thereby providing a voltage output $V_{out}$ 36 as well as a current output $I_{out}$ 38.

The amplitude of $V_{out}$ 36 is given by the output current of each transconductance amplifier 18, 20, 22 and the total impedance seen at nodes 32 and 34, including the impedance seen looking into the emitters of transistors 24 and 26. Resistors 28 and 30 increase the inductive component of the emitter impedance of transistors 24 and 26, boosting $V_{out}$ 36. This design yields a larger amplitude than designs wherein the resistors are added in series with the emitters of transistors 24 and 26 or the output is taken from the collectors of these devices. The value of resistors 28 and 30 can vary by a factor of two with no significant effect on the output amplitude. For further details see J. Chorea, Jr., "Actively-peaked Broadbanded Monolithic Amplifier," *Proc. IEEE*, Vol. 127, pp. 61–66, April 1980, which is incorporated herein by reference.

Figure 2:
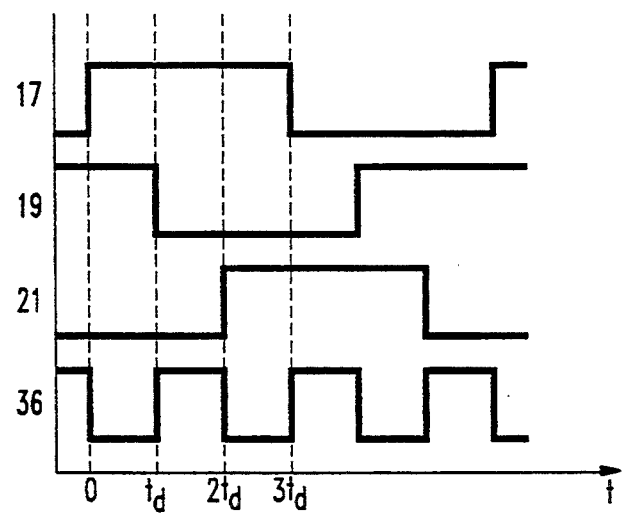
FIG. 2 is a schematic diagram of the waveforms generated by the exemplary embodiment of FIG. 1.

To illustrate the operation of the VCO 10 assume that when one of the outputs 17, 19, or 21 goes high then the corresponding transconductance amplifier 18, 20 or 22 switches its output current from node 32 to node 34. Referring to FIG. 2, at $t=0$ output 17 goes high, causing transconductance amplifier 18 to switch, thus causing voltage output 36 to go low. After one gate delay, at $t=t_d$, inverter 14 receives input from inverter 12 causing output 19 to go low, which switches transconductance amplifier 20, causing voltage output 35 to go high. Similarly, at $t=2t_d$, inverter 16 receives input from inverter 14 causing output 21 to go high, which switches transconductance amplifier 22, driving output voltage 35 low again. As a result, the output voltage 35 of the circuit 10 experiences a full cycle or period every $2t_d$ seconds thus increasing the frequency of the circuit. The oscillation period of the circuit 10 is equal to that of a one stage ting oscillator without suffering from insufficient phase shift or incomplete switching. The oscillation period of a conventional ting oscillator having three stages would be $6t_d$ caused by the $2t_d$ delay in each stage. The frequency of the circuit 10 does not depend on the number of stages in the ting oscillator. Additional stages can be added to the circuit 10 without affecting the oscillation period.

Figure 3:
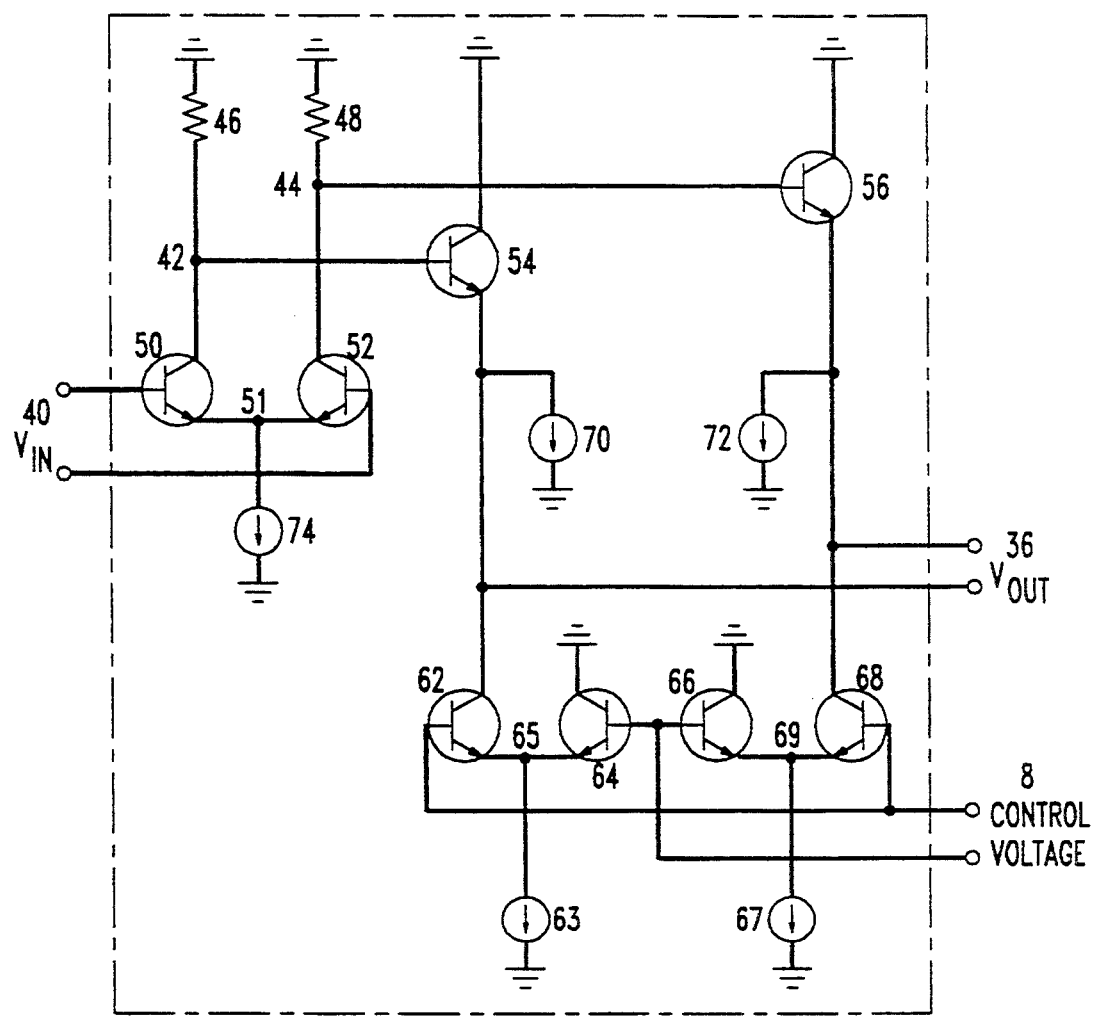
FIG. 3 is a schematic diagram of a differential inverter used in the exemplary embodiment of FIG. 1.

FIG. 3 illustrates an exemplary circuit design for the inverters 12, 14, 16. Each of the inverters 12, 14, 16 is implemented as a differential voltage amplifier and two emitter followers 54, 56. The differential voltage amplifier is comprised of a differential pair 50, 52, with a current source 74 connected to the common emitter 51 of the differential pair 50, 52 and resistors 46 and 48 connected in series to the collectors of differential pair 50, 52 respectively. Differential pair 62, 54 with current source 63 connected to the common emitter 65 of the differential pair 52, 64, and differential pair 66, 58 with current source 67 connected to the common emitter 69 of the differential pair 66, 68, adjust the bias current of the emitter followers to fine-tune the frequency of oscillation. Current sources 70 and 72 are used to avoid starving emitter followers 54 and 55 during loop transients as well as provide a means for coarse frequency adjustment. Thus when $V_{in}$ 40 goes high then points 42 and 44 go low, causing $V_{out}$ 36 to go low.

Figure 4:
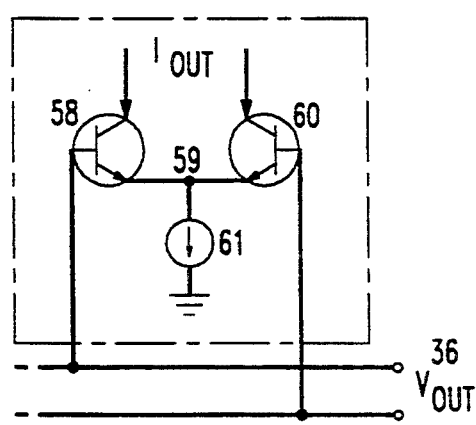
FIG. 4 is a schematic diagram of a transconductance amplifier used in the exemplary embodiment of FIG. 1.

FIG. 4 illustrates an exemplary circuit design for the transconductance amplifiers 18, 20, 22. Each transconductance amplifier consists of a differential pair 58, 60 with a current source 61 connected to the common emitter 59 of the differential pair 58, 60.

The inverters 12, 14, 16 and tranconductance amplifiers 18, 20, 22 can be implemented using ECL, CMOS, or BiCMOS technologies. Additionally, the inverters 12, 14, 16, the transconductance amplifiers 18, 20, 22 and the control voltage 8 can be differential, as shown in FIG. 1, or single ended. Having described the preferred embodiment of this invention, it would be apparent to one skilled in the art to implement this invention using various designs. Therefore, this invention should not be limited to the disclosed embodiment.

I claim:

1. An article comprising a voltage controlled oscillator comprising:
    a plurality of amplifiers connected in a ring, each amplifier having an input, an output and a control port;
    a means for a control signal which is coupled to the control port of each amplifier; and
    a plurality of transconductance amplifiers, each transconductance amplifier corresponds to one of said amplifiers, each transconductance amplifier having an input and output port, wherein the output of each amplifier is coupled to the input of the corresponding transconductance amplifier and the outputs of all transconductance amplifiers are summed.

2. An article according to claim 1, further comprising a means to provide an output voltage.

3. An article according to claim 2, further comprising a means to increase the amplitude of the output voltage.

4. An article according to claim 1, wherein the amplifiers are inverters.

5. An article according to claim 1, wherein the amplifiers and transconductance amplifiers are implemented using emitter coupled logic.

6. An article according to claim 1, wherein the amplifiers and transconductance amplifiers are implemented using bipolar complementary metal-oxide semiconductor logic.

7. An article according to claim 1, wherein the amplifiers and transconductance amplifiers are implemented using complementary metal oxide semiconductor.

8. An article according to claim 1, wherein the amplifiers, transconductance amplifiers and control signal are differential.

9. An article according to claim 1, wherein the amplifiers, transconductance amplifiers and control signal are single-ended.

* * * * *